(12) United States Patent
Maillot et al.

(10) Patent No.: US 12,160,973 B2
(45) Date of Patent: Dec. 3, 2024

(54) SYSTEM PROVIDING A NETWORK INTERFACE TO A PLURALITY OF ELECTRONIC COMPONENTS

(71) Applicant: OVH, Roubaix (FR)

(72) Inventors: Patrick-Gilles Maillot, Marsanne (FR); Christophe Maurice Thibaut, Noyelles les Seclin (FR)

(73) Assignee: OVH, Roubaix (FR)

( * ) Notice: Subject to any disclaimer, the term of this patent is extended or adjusted under 35 U.S.C. 154(b) by 127 days.

(21) Appl. No.: 17/825,007

(22) Filed: May 26, 2022

(65) Prior Publication Data

US 2022/0386501 A1 Dec. 1, 2022

(30) Foreign Application Priority Data

May 31, 2021 (EP) .................................... 21305726

(51) Int. Cl.
*H05K 7/14* (2006.01)

(52) U.S. Cl.
CPC ................................. *H05K 7/1492* (2013.01)

(58) Field of Classification Search
CPC .. H05K 7/1492; H05K 7/1438; H05K 7/1452; H05K 7/1449; H05K 7/1491; G06F 13/4022; G06F 13/385; H01R 12/716; H01R 24/005; H01R 2201/04; H01R 12/737
USPC ....................................................... 340/650
See application file for complete search history.

(56) References Cited

U.S. PATENT DOCUMENTS

| | | | | |
|---|---|---|---|---|
| 7,383,373 | B1 * | 6/2008 | Strickland | G06F 1/04 370/242 |
| 9,122,810 | B2 * | 9/2015 | Hormuth | H04L 41/06 |
| 2006/0059290 | A1 * | 3/2006 | McKeown | G06F 13/4068 710/305 |

(Continued)

FOREIGN PATENT DOCUMENTS

JP 2011100470 A 5/2011

OTHER PUBLICATIONS

Extended European Search Report with regard to the counterpart EP Patent Application No. 21305726.8 completed Dec. 14, 2021.

(Continued)

*Primary Examiner* — Eric Blount
(74) *Attorney, Agent, or Firm* — BCF LLP

(57) ABSTRACT

A system provides a network interface to electronic components. The system comprises a rack, having a plurality of rack stages, each of which is configured to receive a corresponding electronic component. One peripheral component interconnect express (PCIe) connector corresponds to each rack stage and is connectable to the corresponding electronic component when received in the rack stage. The PCIe connectors are assembled in a PCIe connector group. Each PCIe connector of the PCIe connector group has a same number of active serial links. The system also comprises a network adaptor that provides a serial link termination for each active serial link of the PCIe connector group. The network adaptor comprises a communication interface for communicating with a network. The network adaptor is configured to multiplex signals exchanged between the network and the PCIe connectors of the PCIe connector group.

13 Claims, 6 Drawing Sheets

(56) References Cited

U.S. PATENT DOCUMENTS

| | | | | |
|---|---|---|---|---|
| 2013/0325998 A1* | 12/2013 | Hormuth | ................ | H04L 41/06 |
| | | | | 709/212 |
| 2014/0019661 A1* | 1/2014 | Hormuth | ................ | G06F 13/00 |
| | | | | 710/306 |
| 2016/0335209 A1* | 11/2016 | Jau | .................... | G06F 13/4068 |
| 2020/0178413 A1 | 6/2020 | Thibaut et al. | | |
| 2020/0260608 A1 | 8/2020 | Thibaut | | |

OTHER PUBLICATIONS

English Abstract for JP2011100470 retrieved on Espacenet on May 24, 2022.

\* cited by examiner

SYSTEM PROVIDING A NETWORK INTERFACE TO A PLURALITY OF ELECTRONIC COMPONENTS

CROSS-REFERENCE

The present application claims priority from European Patent Application No. 21305726.8, filed on May 31, 2021, the disclosure of which is incorporated by reference herein in its entirety.

FIELD

The present technology relates to enclosures adapted to receive electronic components. In particular, a system providing a network interface to a plurality of electronic components is disclosed.

BACKGROUND

Electronic components, for example servers, memory banks, computer disk drives, and the like, are conventionally grouped in equipment racks. Large data centers that may contain thousands of racks supporting thousands or even tens of thousands of servers and other electronic components. Some data centers grow in size at very fast rates. Some electronic components may fail or become outdated and need to be replaced from time to time; it is expected that the lifetime of a data center infrastructure, including the racks, will far exceed the lifetime of many of its electronic components. Installation and removal of electronic component in equipment racks is a daily routine task for operators.

Proper mounting of an electronic component in a rack may require proper alignment of the electronic component, and connection of the server to cooling facilities, to power delivery facilities, and to a network. Conventionally, electronic equipment alignment and connections used for powering, cooling and networking functions are handled the operators. Power cables, network cables and cooling means need to be handled manually. Installation and removal of electronic components in equipment racks are therefore delicate and time-consuming operations.

A rack adapted for receiving a component (for example a server) and a system including the rack and the component are described in United States Patent Application Publication No. 2020/0178413 A1 to Christophe Maurice Thibaut et al., published on Jun. 4, 2020, the disclosure of which is incorporated by reference herein. The rack includes a backplane, a pair of side panels extending from the backplane and internal support members on each side. The side panels and the internal support members mechanically guide an initial alignment of components upon their initial insertion in the rack. Connectors mounted to the backplane are configured to mate with corresponding connectors of each component to mechanically guide a final alignment of each component when the component is further inserted in the rack. Some of these connectors are liquid connectors used to provide cooling liquid within the rack.

A rack adapted for receiving a component (for example a server), a system including the rack and the component and a method of delivering power to a component mounted in a rack are described in United States Patent Application Publication No. 2020/0260608 A1 to Christophe Maurice Thibaut, published on Aug. 13, 2020, the disclosure of which is incorporated by reference herein. This reference expresses how a rack may detect the insertion of a component, for example a server, and start providing power to the component from a backplane of the rack, the power being provided according to power parameters of the component. Insertion detection may be obtained via signaling exchanged on a serial link between the component and the backplane, for example through a RJ45 connection.

FIG. 1 (Prior Art) is a simplified schematic diagram illustrating a serial link connection between a server and a backplane of a rack. The rack is not shown on FIG. 1, other than its backplane 10. A server 20 comprises a generally flat structural plate 22 intended for insertion in the rack in a horizontal position. An upright plate 24 is positioned at a rear end of the server 20 and is intended to abut on the backplane 10 when the server 20 is fully inserted in the rack. A motherboard 26 of the server is mounted on the plate 22. In turn, a networking component 28, for example a networking chip, is mounted on the motherboard 26. A wire 30 connects an RJ45 connector 32 mounted on the upright plate 24 to the networking component 28. When the server 20 is fully inserted in the rack, the RJ45 connector 32 mates with a corresponding RJ45 connector 12 that is attached to the backplane 10. This RJ45 connector 12 may be connected to a corresponding RJ45 connector 42 of a router 40 via another wire 14, allowing to obtain a network connection between the server 20 and external devices via the router 40. The diagram of FIG. 1 is simplified for ease of illustration. Other components, not shown, include for example a casing for the rack, support members for maintaining the server 20 in position in the rack, and electrical connections allowing power to be distributed from the backplane 10 to the server 20. The server 20 may include various additional components such as a processor, a disk drive, and the like. The rack may include a plurality of stages, which may for example be superposed vertically, so that a plurality of servers 20 may be mounted in the rack one above the other, each rack 20 including a respective RJ45 connector 32 mating with a respective RJ45 connector 12 in a corresponding stage of the backplane 10. In such case, each RJ45 connector 12 mounted on the backplane 10 may be connected via a respective wire 14 to a respective RJ connector 42 of the same or of another router 40.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise time-consuming operations required to install and remove electronic components in equipment racks.

In one aspect, various implementations of the present technology provide a system providing a network interface to a plurality of electronic components, the system comprising:
  a rack having a plurality of rack stages, each rack stage being configured to receive a corresponding electronic component;

a plurality of peripheral component interconnect express (PCIe) connectors, one PCIe connector corresponding to each rack stage and being connectable to the corresponding electronic component when received in the rack stage, the PCIe connectors being assembled a PCIe connector group, each PCIe connector of the PCIe connector group having a number of active serial links;

a network adaptor providing a serial link termination for each active serial link included in the PCIe connector group, the network adaptor comprising a communication interface for communicating with a network, the network adaptor being configured to multiplex signals exchanged between the network and the PCIe connectors of the PCIe connector group.

In some implementations of the present technology, the network adaptor is a network interface controller.

In some implementations of the present technology, the PCIe connector corresponding to a given rack stage is configured to be connected to a PCIe connector of an electronic component inserted in the given rack stage, the number of active serial links of the PCIe connector corresponding to the given rack stage being equal to a number of active serial links on the PCIe connector of the electronic component inserted in the given rack stage.

In some implementations of the present technology, each PCIe connector of the PCIe connector group has n active serial links; the PCIe connector group comprises m PCIe connectors for m corresponding rack stages; and the network adaptor provides serial link terminations for m·n active serial links.

In some implementations of the present technology, serial link terminations {1 to n} provided by the network adaptor are allocated to n serial links of the PCIe connector mounted on a first electronic component inserted in a first rack stage; serial link terminations {n+1 to 2n} provided by the network adaptor are allocated to n serial links of the PCIe connector mounted on a second electronic component inserted in a second rack stage; and m is equal to 2 rack stages.

In some implementations of the present technology, serial link terminations {1 to n} provided by the network adaptor are allocated to n serial links of the PCIe connector mounted on a first electronic component inserted in a first rack stage; serial link terminations {n+1 to 2n} provided by the network adaptor are allocated to n serial links of the PCIe connector mounted on a second electronic component inserted in a second rack stage; and serial link terminations {(m−1)·n+1 to n·m} provided by the network adaptor are allocated to n serial links of the PCIe connector mounted on a $m^{th}$ electronic component inserted in a $m^{th}$ rack stage.

In some implementations of the present technology, the network adaptor is further configured to deliver of a clock signal in at least one of serial link terminations {1 to n}, in at least one of serial link terminations {1 to n}, and in at least one of serial link terminations {(m−1)·n+1 to n·m}.

In some implementations of the present technology, the network adaptor is configured to indicate to each of m electronic components inserted in the m rack stages that it is communicating with virtual serial links {1 to n} of a virtual NIC.

In some implementations of the present technology, the rack further comprises a backplane; and the PCIe connectors are mounted on the backplane.

In some implementations of the present technology, the system further comprises a plurality of power supply connections, one power supply connection being mounted on the backplane in each of the rack stages, a given power supply connection corresponding to a given rack stage being configured to deliver power to a given electronic component when the given electronic component is inserted in the given rack stage.

In some implementations of the present technology, a given PCIe connector and the given power supply connection corresponding to the given rack stage are configured to be concurrently connected to the given electronic component inserted in the given rack stage.

In some implementations of the present technology, the system comprises a plurality of network adaptors and a corresponding plurality of PCIe connector groups.

In some implementations of the present technology, each PCIe connector of a first PCIe connector group comprises a first number of active serial links; and each PCIe connector of a second PCIe connector group comprises a second number of active serial links.

In some implementations of the present technology, a first PCIe connector group comprises a first number of PCIe connectors; and a second PCIe connector group comprises a second number of PCIe connectors.

In some implementations of the present technology, the network adaptor comprises a switch or a router configured to: assemble outgoing signals from each of the PCIe connectors into a common stream of signals sent to the network; and route each incoming signal from the network to one of the PCIe connectors based on an address included in the incoming signal.

In another aspect, various implementations of the present technology provide a method of providing a network interface to an electronic component, comprising:

mounting the electronic component in a rack stage of the system to cause a PCIe connector and a power socket mounted to the electronic component to respectively connect to a PCIe connector and to a power supply connection corresponding to the rack stage; and in response to a delivery of power to the electronic component, starting or restarting the electronic component.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
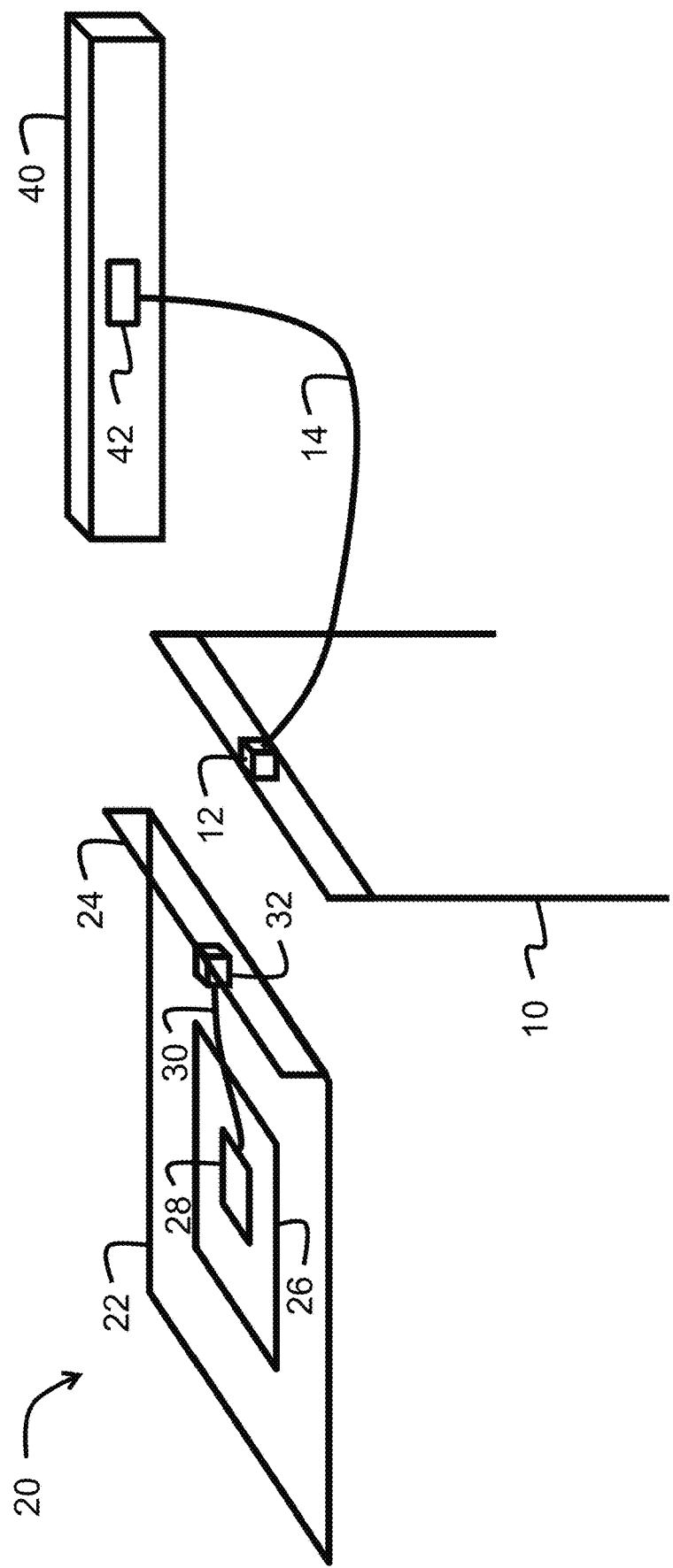
FIG. 1 (Prior Art) is a simplified schematic diagram illustrating a serial link connection between a server and a backplane of a rack.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In an aspect, the present technology, a system provides a network interface to a plurality of electronic components compatible with peripheral component interconnect express (PCIe) specifications. Such electronic components may include, for example and without limitation, servers, memory banks, computer disk drives, graphics cards, sound cards, solid-state drives, and the like. The system comprises a rack, a plurality of PCIe connectors and a network adaptor. The rack has a plurality of rack stages, each of which is configured to receive a corresponding electronic component. One PCIe connector corresponds to each rack stage and is connectable to the corresponding electronic component when received in the rack stage. The PCIe connectors are assembled in one or more PCIe connector groups. Each PCIe connector of a PCIe connector group has a same number of active serial links, also called lanes. PCIe connectors of another PCIe connector group may have another number of active serial links, this other number being common to the PCIe connectors of the other PCIe connector group. The network adaptor provides a serial link termination for each active serial link included in the PCIe connector group. The network adaptor comprises a communication interface for communicating with a network. The network adaptor is configured to multiplex signals (or, equivalently, messages) exchanged between the network and the PCIe connectors of the PCIe connector group.

The PCIe connectors present in the rack may be assembled in a plurality of PCIe connector groups corresponding to a plurality of network adaptors.

According to the PCIe specifications, two endpoints may communicate over a short distance (e.g. less than one meter) via a plurality of serial links, also called lanes, the serial links being disposed in parallel. For example and without limitation, 1, 2, 4, 8 or 16 lanes may be used to connect the two endpoints.

With these fundamentals in place, we will now consider some non-limiting examples to illustrate various implementations of aspects of the present technology.

Figure 2:
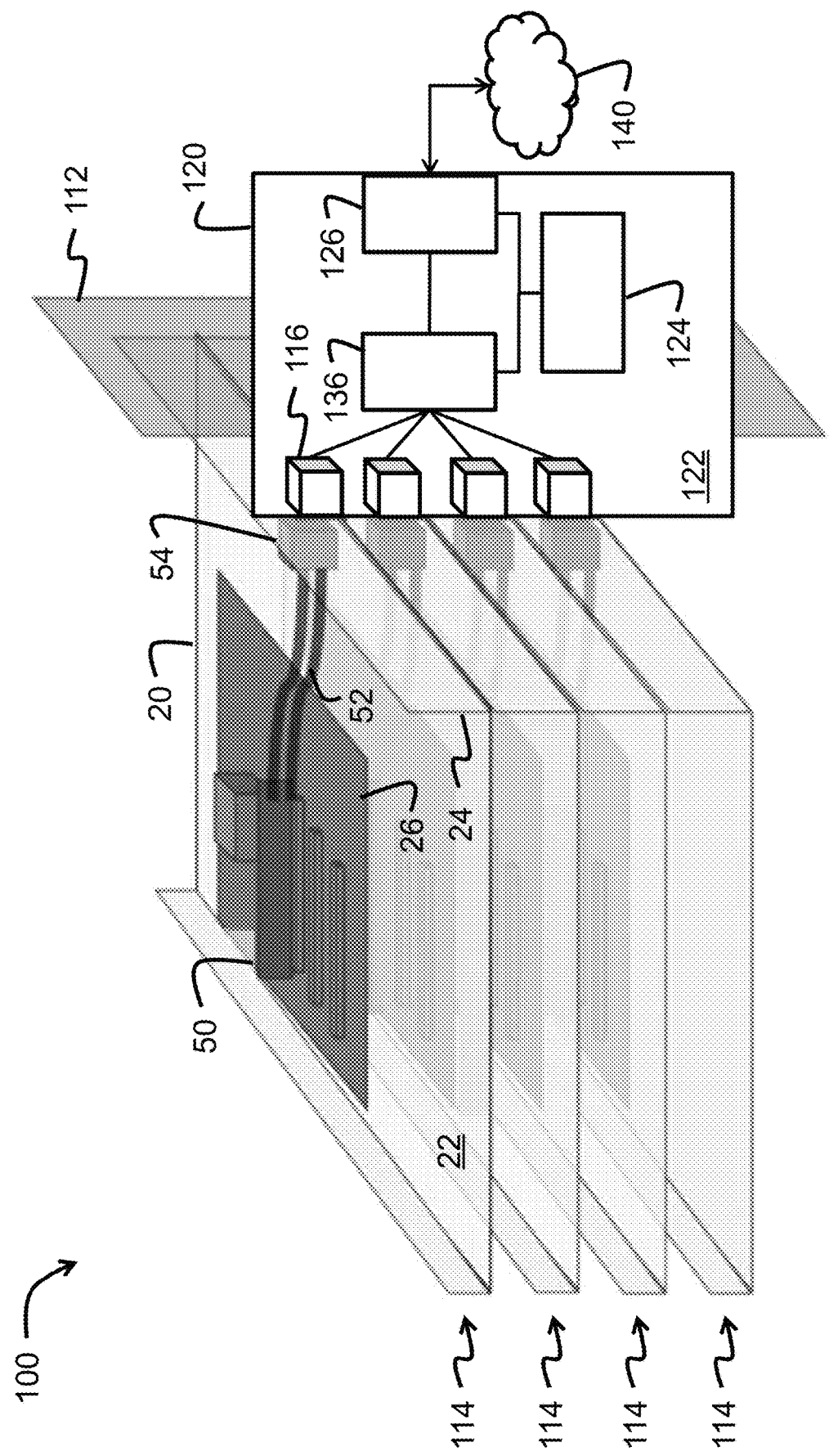
FIG. 2 is a simplified schematic diagram illustrating connecting paths between a plurality of electronic components and a network interface controller in accordance with an embodiment of the present technology.

FIG. 2 is a simplified schematic diagram illustrating connecting paths between a plurality of electronic components and a network interface controller. A system 100 is shown from a rear perspective view. The system 100 comprises a rack 110 (FIG. 4) having a backplane 112 and a plurality of rack stages 114. Several electronic components are received in the rack, one electronic component being installed in each rack stage 114. As expressed hereinabove, electronic components comprise servers, for example the server 20 introduced in the description of FIG. 1. Other electronic components that may received in the rack 110 comprise memory banks, computer disk drives, and the like. The rack 110 may receive various types of electronic components in its rack stages 114. The following passages of the present description will refer to servers 20, instead of the more generic electronic components, for ease of illustration, without limiting the generality of the types of electronic components that may be received in the rack 110.

One PCIe connector 116 is mounted on the backplane 112 at the level of each rack stage 114. Each PCIe connectors 116 has a number of serial links 134 (FIG. 3), at least some of which are connected to active serial links 134 (FIG. 3) of a server 20 (or of other electronic component) to which is it connected. The PCIe connectors 116 are assembled in PCIe connector groups. In the non-limiting example of FIG. 2, one PCIe connector group comprises 4 PCIe connectors 116. Forming PCIe connector groups by assembling 2, 8 or 16 PCIe connectors 116 is also contemplated. The PCIe connectors 116 of the shown PCIe connector group are operatively connected to a network adaptor, for example a network interface controller (NIC) 120. In a non-limiting embodiment, the NIC 120 may be a so-called 'Smart NIC' or a so-called 'Super Smart NIC', which are capable of supporting network traffic processing features. Other types of adaptors or extensions may also be contemplated, for example, a multi-host capable graphics processing unit (GPU) card. The following passages of the present description will refer to a NIC 120, instead of more advanced network, high-end optics, graphics, storage adaptors or extensions, for ease of illustration, without limiting the generality of the present disclosure.

One power supply connection 118 (FIG. 6) may also be mounted on the backplane 112 at the level of each rack stage 114.

The server 20 may substantially be as described in the above description of FIG. 1, with the exception that the server 20 is compatible with PCIe specifications. In more details, the networking component 28 becomes a PCIe interface 50, the wire 30 is replaced by a PCIe cable 52, and the RJ45 connector 32 is replaced by a PCIe connector 54 mounted on the upright plate 24 so that it is connectable to the PCIe connector 116 mounted on the backplane 112 at the level of the rack stage 114 where the server 20 is received. A power input 56 (FIG. 6) may also be mounted on the upright plate 24 of the server 20 so that it is connectable to the power supply connection 118 mounted on the backplane 112 at the level of the rack stage 114 where the server 20 is received. In practice, when the server 20 is received in the rack 110, a connection between the PCIe connector 54 of the server 20 and the PCIe connector 116 present in the rack stage 114 is made concurrently with a connection between the power input 56 of the server 20 and the power supply connection 118 present in the rack stage 114. As such, power may be delivered to the server 20 and cause a start or a restart of the server 20 substantially at the same time as the effective connection of the PCIe connectors 54 and 116.

The NIC 120 comprises a printed circuit board (PCB) 122 on which a processor 124 (or a plurality of cooperating processors), a communication interface 126 and a switch 136 are mounted. The PCIe connectors 116 may be directly mounted on the PCB 122 of the NIC 120, or may be connected to the PCB 122 via cables. The processor 124 is operatively connected to the PCIe connectors 116, to the switch 136 and the communication interface 126 that, in turn, may interface with an external entity such as, for example, a network 140 accessible via a router (not shown). The communication interface 126 may, for example and without limitation, support a 25 GBPS data rate, both in upstream and downstream directions, for each of the 4 servers 20 illustrated on FIG. 2, for a total of 200 GBPS. The communication interface 126 may, for example and without limitation, support an Ethernet connection over an optical fibre connected to an external router. Other data rates and other wired or wireless interfaces are also contemplated. The communication interface 126 may be implemented as a pair of interfaces, one of which being dedicated to upstream communication, the other being dedicated to downstream communication.

Connections between the servers 20 and the NIC 120 are arranged so that each server 20 operates as if it were connected to a dedicated NIC via an ordinary PCIe interface. The NIC 120 therefore defines a plurality of virtual NICs (e.g. 4 virtual NICs), each virtual NIC being independently connected to a respective server 20. In the NIC 120, the switch 136 uses addresses included in signals exchanged between the various servers 20 and the network 140 to properly route each signal. In an incoming direction, the switch 136 routes incoming signals from the network 140 to the appropriate PCIe connectors 116 based on addresses included in the incoming signals. In an outgoing direction, the switch 136 may simply assemble signals received from any one of the PCIe connectors 116 into a common stream of signals sent to the network 140.

As such, the switch 136 provides a multiplexing function in which outgoing signals originating from any one of the servers 20 are directed to the network 140 via the common interface 126. Similarly, the switch 136 demultiplexes incoming signals received from the network 140 via the common interface 126 and redirects the signals to the appropriate server 20. A router or any device capable of supporting such network traffic management functions under control of the processor 124 may be used instead of the switch 136.

Although 4 rack stages 114 receiving 4 servers 20 communicating with one NIC 120 are shown on FIG. 2, the rack 110 may comprise a greater number of rack stages 114 for receiving a greater number of servers 20. The number of servers 20 communicating with the NIC 120 may be less or greater than 4. A plurality of NICs 120 may be mounted in the rack 110 for communicating with a plurality of groups of servers 20. The PCIe connectors 116 may therefore be assembled in a plurality of PCIe connector groups corresponding to the plurality of NICs 120. Groupings of PCIe connectors 116 may vary, as one PCIe connector group may include, for example, 4 PCIe connectors 116 while another PCIe connector group may include, for example, 2 PCIe connectors 116. Similarly, each server 20 corresponding to a first PCIe connector group may use, for example, 2 active serial links and each server 20 corresponding to a second PCIe connector group may use, for example, 8 active serial links.

In an embodiment, liquid connectors (not shown) as described in United States Patent Application Publication No. 2020/0178413 A1 may be mounted on the server 20 and in each rack stage 114, allowing to provide at once network, power and cooling connections to the server 20 by the simple insertion of the server 20 in the rack 110, without any need for manual handling of wires, cables or cooling supplies. Similarly, network, power and cooling connections to the server 20 may be cut by the simple removal of the server 20 from the rack 110. The present technology thus renders possible the installation and disposal of servers and other electronic components using automated facilities, for example robots.

The various servers 20 received in the rack 110 are conventionally constructed to use a number n of active serial links 58 on their PCIe interfaces 50, the serial links 58 being numbered from {1 to n}. The PCIe interface 50 of a server 20 may support a greater number of serial links; active serial links are all or a subset of the serial links supportable by the PCIe interface 50 that are actually used by the server 20, the other serial links supportable by the PCIe interface 50 being inactive. The NIC 120 terminates the active serial links $58_1$ to $58_n$ for a number m of servers 20 (i.e. for m rack stages 114). Otherwise stated, m PCIe connectors 116 mounted on the backplane 112 at the level of them rack stages 114 are part of a same PCIe connector group. The NIC 120 therefore provides serial link terminations 130 for actively exchanging signals and data between the NIC 120 and m·n active serial links 58 of the m servers 20. The present technology therefore introduces a departure from the conventional PCIe technology, in that PCIe connections are no longer established between two endpoints, because them of servers communicate with a single NIC 120 via m PCIe connections.

Figure 3:
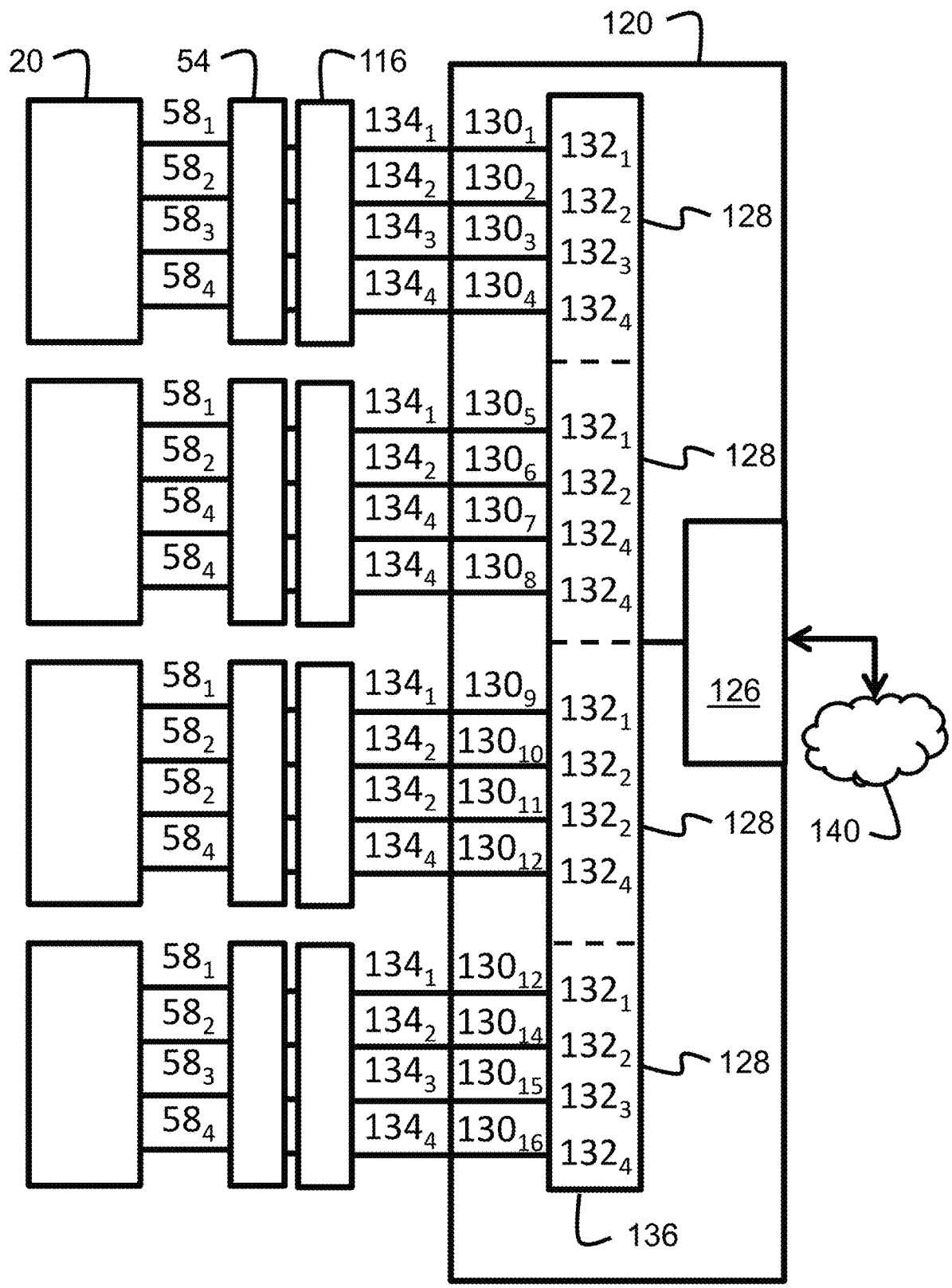
FIG. 3 is a diagram illustrating a mapping of active serial link connections between the electronic components and the network interface controller of FIG. 2 in accordance with an embodiment of the present technology.

FIG. 3 is a diagram illustrating a mapping of active serial links the electronic components and the network interface controller of FIG. 2. FIGS. 2 and 3 illustrate a non-limiting example in which the number n of active serial links 58 on the PCIe interface 50 of each server 20 is equal to 4, the number m of servers 20 being also equal to 4. The PCIe interfaces 50 may be constructed for connection to wider PCIe cables supporting larger numbers of serial links 58 but, in the example of FIG. 3, the servers 20 only use 4 serial links $58_1$ to $58_4$, which are therefore considered active. Inactive serial links of the servers 20 and the processor 124 are not shown on FIG. 3 in order to simplify the illustration. Each active serial link $58_1$ to $58_4$ of the servers 20 mounted in 4 rack stages 114 is connected, via a respective PCIe connector 54, to a serial link $134_1$ to $134_4$ of the PCIe connectors 116 present in the same 4 rack stages 114. Given that the serial links $134_1$ to $134_4$ are connected to the active serial links $58_1$ to $58_4$, they also become active serial links $134_1$ to $134_4$. The 4 active serial links $58_1$ to $58_4$ of each of the 4 servers combine to form 16 active serial links 58 corresponding to serial link terminations $130_1$ to $130_{16}$ of the NIC 120. The NIC 120 may be capable of supporting a number of serial link terminations that is greater than m·n (i.e. 16 serial link terminations 130 in the example of FIG. 3); any number of inactive serial link terminations of the NIC 120 are not shown on FIG. 3. In the NIC 120, the processor 124 defines 4 virtual NICs 128 within the switch 136 (or router or other network traffic management device), each virtual NIC 128 indicating to a corresponding one of the 4 servers 20 that it is communicating with virtual serial links $132_1$ to $132_4$ of the virtual NIC 128. In this manner, the servers 20 do not need to implement any unconventional feature for interworking with the NIC 120, as it may act as if it were the sole electronic component being in communication with the NIC 120 via the PCIe connection. Upon start or restart that follows their insertion in the rack 110 and the delivery of power, each server 20 initializes its mapping of active serial links 58 on its PCIe interface 50. The switch 136 implements the virtual NICs 128 so that they may multiplex and demultiplex signals exchanged between the servers 20 and the network 140, as expressed hereinabove.

The NIC 120 generates a clock signal in at least one of the serial link terminations $130_1$ to $130_4$, in at least one of the serial link terminations $130_5$ to $130_8$, in at least one of the serial link terminations $130_9$ to $130_{12}$, and in at least one of the serial link terminations $130_{13}$ to $130_{16}$. The servers 20 rely on the clock signal for timing of data exchanged on the PCIe connection.

Figure 4:
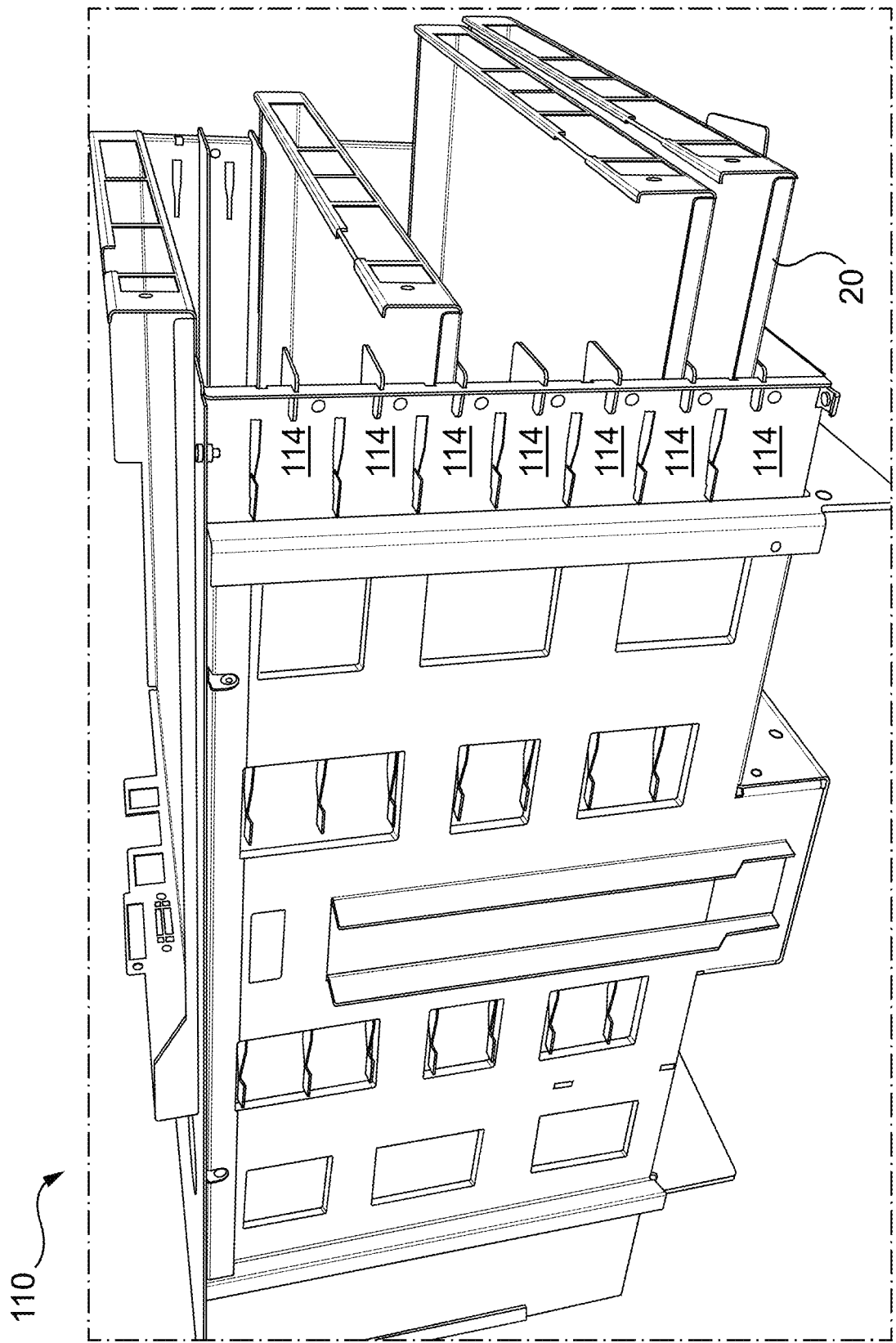
FIG. 4 is a perspective view of a rack configured to receive the electronic components and the network interface controller of FIG. 2 in accordance with an embodiment of the present technology.
Figure 5:
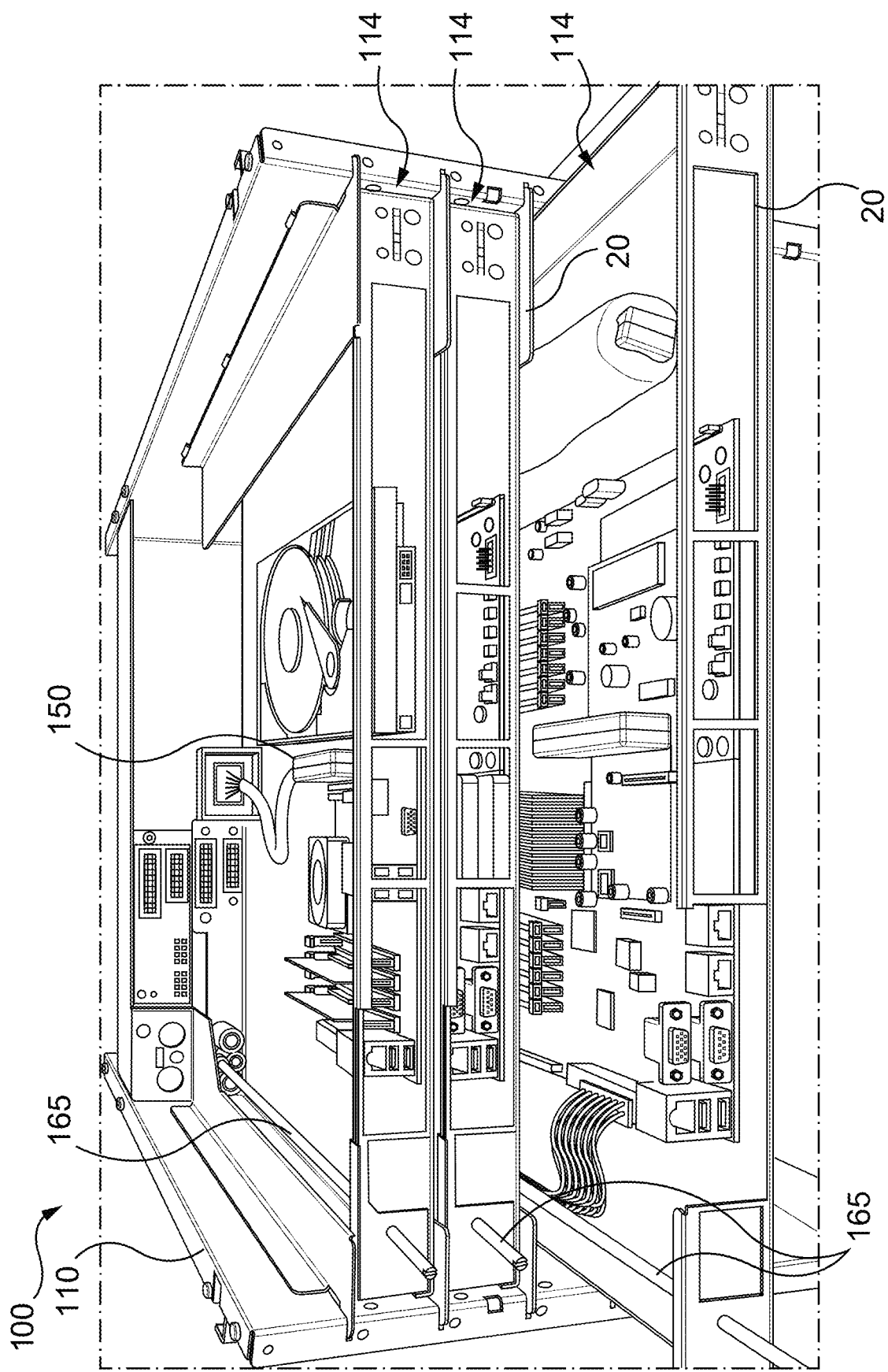
FIG. 5 is a front view of the rack of FIG. 4 showing electronic components being partially or fully inserted in the rack in accordance with an embodiment of the present technology.

FIG. 4 is a perspective view of a rack configured to receive the electronic components and the network interface controller of FIG. 2. FIG. 5 is a front view of the rack of FIG. 4 showing electronic components being partially or fully inserted in the rack. In particular, FIG. 5 shows that an electronic component of a first type, a hard disk drive 150, is received in a higher rack stage 114 while electronic components of a second type, servers 20, are received in two other rack stages 114, one of these servers 20 being partially inserted in the rack 110. It may be observed that the platform of the hard disk drive 150 has a set of liquid connectors 160 operable via a rod 165, as described in United States Patent Application Publication No. 2020/0178413 A1. These liquid connectors 160 may be used to provide cooling to the hard disk drive 150. Although liquid connectors are not visible on the servers 20, a partial view of the rod 165 on each server 20 reveals that they may also benefit from the same type of cooling.

Figure 6:
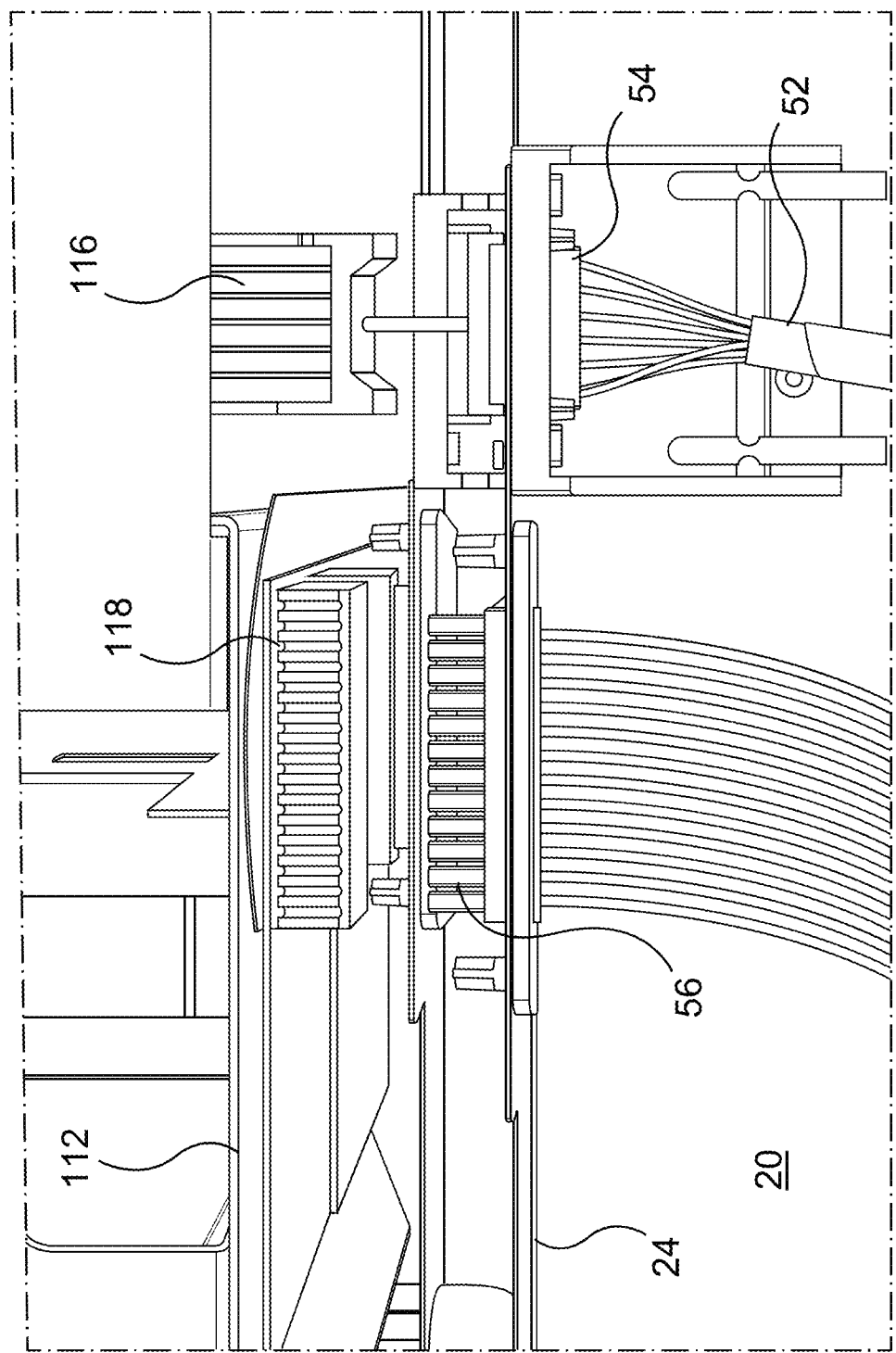
FIG. 6 is a detailed top plan view of a connection between an electronic component and a backplane of the rack in accordance with an embodiment of the present technology.

FIG. 6 is a detailed top plan view of a connection between an electronic component and the backplane of the rack. A server 20 is almost fully inserted in the rack 100. At that time, the PCIe connector 54 mounted on the upright plate 24 of the server 20 is about to be connected with the PCIe connector 116 present in the rack stage 114 and the power input 56 mounted on the upright plate 24 of the server 20 is about to be connected with the power supply connection 118 present in the rack stage 114.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A system providing a network interface to a plurality of electronic components, the system comprising:
   a rack having a plurality of rack stages, each rack stage being configured to receive a corresponding electronic component;
   a plurality of peripheral component interconnect express (PCIe) connectors; and
   a network adaptor comprising a communication interface for communicating with a network,
   wherein one PCIe connector is mounted in each rack stage to a backplane of the rack and is configured to connect to a PCIe connector of the corresponding electronic component when the corresponding electronic component is received in the rack stage, a group of PCIe connectors being assembled in a PCIe connector group, each PCIe connector of the PCIe connector group having a plurality of serial links, at least a subset of the serial links becoming active when the corresponding electronic component is received in the rack stage, a number of active serial links of a given PCIe connector mounted in a given rack stage being equal to a number of active serial links on a given PCIe connector of a given electronic component inserted in the given rack stage;
   wherein the network adaptor comprises a switch or a router configured to:
      assemble outgoing signals from each of the PCIe connectors of the PCIe connector group into a common stream of signals sent to the network; and
      route each incoming signal from the network to one of the PCIe connectors of the PCIe connector group based on an address included in the incoming signal; and
   wherein the network adaptor is operatively connected to the PCIe connectors of the PCIe connector group and provides a serial link termination for each active serial link included in the PCIe connector group, the network adaptor being configured to multiplex signals exchanged between the network and the PCIe connectors of the PCIe connector group.

2. The system of claim 1, wherein the network adaptor is a network interface controller.

3. The system of claim 1, wherein:
   each PCIe connector of the PCIe connector group has n active serial links;
   the PCIe connector group comprises m PCIe connectors for m corresponding rack stages; and
   the network adaptor provides serial link terminations for m·n active serial links.

4. The system of claim 3, wherein:
   serial link terminations {1 to n} provided by the network adaptor are allocated to n serial links of a first PCIe connector mounted on a first electronic component inserted in a first rack stage;
   serial link terminations {n+1 to 2n} provided by the network adaptor are allocated to n serial links of a second PCIe connector mounted on a second electronic component inserted in a second rack stage; and
   m is equal to 2 rack stages.

5. The system of claim 3, wherein:
   serial link terminations {1 to n} provided by the network adaptor are allocated to n serial links of a first PCIe connector mounted on a first electronic component inserted in a first rack stage;
   serial link terminations {n+1 to 2n} provided by the network adaptor are allocated to n serial links of a second PCIe connector mounted on a second electronic component inserted in a second rack stage; and
   serial link terminations {(m−1)·n+1 to n·m} provided by the network adaptor are allocated to n serial links of a $m^{th}$ PCIe connector mounted on a $m^{th}$ electronic component inserted in a $m^{th}$ rack stage.

6. The system of claim 5, wherein the network adaptor is further configured to deliver a clock signal in at least one of serial link terminations {1 to n}, in at least one of serial link terminations {n+1 to 2n}, and in at least one of serial link terminations {(m−1)·n+1 to n·m}.

7. The system of claim 4, wherein the network adaptor is configured to indicate to each of m electronic components inserted in the m rack stages that it is communicating with virtual serial links {1 to n} of a virtual network interface controller (NIC).

8. The system of claim 1, further comprising a plurality of power supply connections, one power supply connection being mounted on the backplane in each of the rack stages, a given power supply connection corresponding to the given rack stage being configured to deliver power to the given electronic component when the given electronic component is inserted in the given rack stage.

9. The system of claim 8, wherein the given PCIe connector and the given power supply connection corresponding to the given rack stage are configured to be concurrently connected to the given electronic component inserted in the given rack stage.

10. The system of claim 1, wherein the system comprises a plurality of network adaptors and a corresponding plurality of PCIe connector groups.

11. The system of claim 10, wherein:
    each PCIe connector of a first PCIe connector group comprises a first number of active serial links; and
    each PCIe connector of a second PCIe connector group comprises a second number of active serial links.

12. The system of claim 10, wherein:
    a first PCIe connector group comprises a first number of PCIe connectors; and
    a second PCIe connector group comprises a second number of PCIe connectors.

13. A method of providing a network interface to an electronic component, comprising:
    mounting a particular electronic component in a particular rack stage of the system as defined in claim 8 to cause a PCIe connector and a power socket mounted to the particular electronic component to respectively connect to a particular PCIe connector and to a particular power supply connection mounted in the particular rack stage; and
    in response to a delivery of power to the particular electronic component, starting or restarting the particular electronic component.

* * * * *